(12) United States Patent
Zhou

(10) Patent No.: US 10,706,758 B2
(45) Date of Patent: Jul. 7, 2020

(54) SHIFT REGISTER UNIT, DRIVING METHOD THEREOF AND DISPLAY DEVICE

(71) Applicant: BOE TECHNOLOGY GROUP CO., LTD., Beijing (CN)

(72) Inventor: Yifang Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 252 days.

(21) Appl. No.: 15/749,571

(22) PCT Filed: Oct. 24, 2016

(86) PCT No.: PCT/CN2016/102999
§ 371 (c)(1),
(2) Date: Feb. 1, 2018

(87) PCT Pub. No.: WO2017/092514
PCT Pub. Date: Jun. 8, 2017

(65) Prior Publication Data
US 2018/0226008 A1 Aug. 9, 2018

(30) Foreign Application Priority Data
Dec. 4, 2015 (CN) .......................... 2015 1 0886307

(51) Int. Cl.
*G11C 19/00* (2006.01)
*G09G 3/20* (2006.01)
(Continued)

(52) U.S. Cl.
CPC ............... *G09G 3/20* (2013.01); *G11C 19/28* (2013.01); *G09G 3/3677* (2013.01);
(Continued)

(58) Field of Classification Search
None
See application file for complete search history.

(56) References Cited

U.S. PATENT DOCUMENTS 10,127,878 B1 * 11/2018 Lv ........................... G11C 19/28
10,176,746 B2 * 1/2019 Lim ....................... G09G 3/2092
(Continued)

FOREIGN PATENT DOCUMENTS

CN     102237034 A     11/2011
CN     102867543 A     1/2013
(Continued)

OTHER PUBLICATIONS

International Search Report of PCT/CN2016/102999 in Chinese, dated Feb. 3, 2017 with English translation.
(Continued)

*Primary Examiner* — Tuan T Lam
(74) *Attorney, Agent, or Firm* — Collard & Roe, P.C.

(57) ABSTRACT

A shift register unit, driving method thereof and display device are provided. The shift register unit includes an input module (P1), a pull-down compensation module (P2), a pull-down module (P4) and a pull-up module (P3), wherein the pull-down compensation module (P2) is used to pull down at least twice a signal of a pull-down control node (QB) when a signal of a pull-up control node (Q) is in a high-level state to pull down the signal of the pull-down control node (QB) to the low-level state. The accuracy of the signal of the pull-down control node can be ensured even in such conditions as instability, high or low temperature in the manufacturing process, and the influence on signals transmitted in a shift register unit caused by the instability, high or low temperature and so on in the manufacturing process is reduced thereby improving the display effect of the display device.

20 Claims, 7 Drawing Sheets

(51) Int. Cl.
*G11C 19/28* (2006.01)
*G09G 3/36* (2006.01)
(52) U.S. Cl.
CPC .............. *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 2007/0040771 A1* | 2/2007 | Chung | G11C 19/00 345/76 |
| 2014/0176410 A1 | 6/2014 | Ma et al. | |
| 2014/0320466 A1 | 10/2014 | Son | |
| 2015/0029082 A1 | 1/2015 | Jeon et al. | |
| 2015/0255031 A1* | 9/2015 | Cao | G09G 3/3648 345/210 |
| 2016/0358566 A1 | 12/2016 | Li et al. | |
| 2016/0379545 A1* | 12/2016 | Zhou | G11C 19/28 345/213 |
| 2017/0186393 A1 | 6/2017 | Wang | |
| 2018/0174660 A1* | 6/2018 | Li | G09G 3/3266 |
| 2018/0182337 A1* | 6/2018 | Lv | G11C 19/28 |
| 2018/0190231 A1* | 7/2018 | Shi | G09G 3/3655 |
| 2018/0218698 A1* | 8/2018 | Li | G09G 3/3674 |
| 2018/0277043 A1* | 9/2018 | Li | G09G 3/20 |
| 2018/0286490 A1* | 10/2018 | Sun | G11C 19/184 |
| 2018/0366067 A1* | 12/2018 | Jang | G09G 3/3266 |
| 2019/0005866 A1* | 1/2019 | Li | G09G 3/20 |

FOREIGN PATENT DOCUMENTS

| | | |
|---|---|---|
| CN | 103050106 A | 4/2013 |
| CN | 104252853 A | 12/2014 |
| CN | 104700814 A | 6/2015 |
| CN | 104835475 A | 8/2015 |
| CN | 105336291 A | 2/2016 |
| KR | 10-2014-0024994 A | 3/2014 |

OTHER PUBLICATIONS

Notice of Transmittal of the International Search Report of PCT/CN2016/102999 in Chinese, dated Feb. 3, 2017.
Written Opinion of the International Searching Authority of PCT/CN2016/102999 in Chinese, dated Feb. 3, 2017 with English translation.
Chinese Office Action in Chinese Application No. 201510886307.0, dated Jul. 4, 2017 with English translation.

* cited by examiner

SHIFT REGISTER UNIT, DRIVING METHOD THEREOF AND DISPLAY DEVICE

CROSS REFERENCE TO RELATED APPLICATIONS

This application is the National Stage of PCT/CN2016/102999 filed on Oct. 24, 2016, which claims priority under 35 U.S.C. § 119 of Chinese Application No. 201510886307.0 filed on Dec. 4, 2015, the disclosure of which is incorporated by reference.

TECHNICAL FIELD

The present disclosure relates to a shift register unit, a driving method thereof and a display device.

BACKGROUND

When a display device is displaying, it needs to utilize a shift register to implement scanning of a pixel unit. The shift register comprises multiple stages of shift register units, each of which is corresponding to one row of pixel units. Progressive scanning drive of the pixel units of the display device is realized by the multiple stages of shift register units, so as to display an image.

In the shift register, each stage of shift register unit is constituted of a plurality of thin film transistors, and signals in the shift register unit are transmitted by respective thin film transistors. However, a threshold voltage of a thin film transistor is easily influenced by degree of stability and temperature in the manufacturing process. Under the condition of instability, high temperature or low temperature in the process of manufacturing, the threshold voltage of the thin film transistor would change dramatically, such that a signal of a pull-up control node and a signal of a pull-down control node in the shift register unit are distorted, thereby causing that signals output by the shift register unit are distorted seriously, or sometimes even causing that the shift register unit cannot output signals. As a result, the display effect of the display device is reduced.

SUMMARY

There is provided in the present disclosure a shift register unit, a driving method thereof and a display device, which are used for reducing influence on signals transmitted in a shift register unit caused by such situations as instability, the high temperature and the low temperature in the manufacturing process, so that the display effect of the display device is improved.

According to a first aspect of the present disclosure, there is provided a shift register unit, comprising:

an input module, connected to a trigger signal terminal, a pull-down signal terminal, a first clock signal terminal, a low level terminal and a pull-up control node, and configured to transmit a signal of the trigger signal terminal or a signal of the low level terminal to the pull-up control node under control of the signal of the trigger signal terminal, a signal of the first clock signal terminal and a signal of the pull-down signal terminal;

a pull-down compensation module, connected to a control signal terminal, the pull-up control node, a pull-down control node and the low level terminal, and configured to pull down a signal of the pull-down control signal at least twice when a signal of the pull-down control node is in a high-level state to pull down the signal of the pull-down control node to a low-level state;

a pull-up module, connected to a second clock signal terminal, the pull-up control node and an output terminal of the shift register unit, and configured to pull up a signal of the output terminal of the shift register unit to the high-level state and pull up the signal of the pull-up control node to the high-level state by its own bootstrap phenomenon under control of the signal of the pull-up control node and a signal of the second clock signal terminal; and a pull-down module, connected to the input module, the pull-up module, the pull-up control node, the pull-down control node, the low level terminal and the output terminal of the shift register unit, and configured to pull down the signal of the output terminal of the shift register to the low-level state under control of the signal of the pull-down control node, wherein the pull-up control node is a connection node of the input module, the pull-down compensation module, the pull-up module and the pull-down module, and the pull-down control node is a connection node of the pull-down compensation module and the pull-down module.

According to a second aspect of the present disclosure, there is provided a driving method of a shift register unit, comprising:

in a first phase, receiving, by an input module, a signal of the trigger signal terminal, a signal of a first clock signal terminal, and a signal of a pull-down signal terminal, and transmitting a signal of the trigger signal terminal or a signal of a low level terminal to a pull-up control node under control of the signal of the trigger signal terminal, the signal of the first clock signal terminal and the signal of the pull-down signal terminal; pulling down, by a pull-down compensation module, a signal of a pull-down control node when the pull-up control node is in a high-level state, so that the signal of the pull-down control node is pulled down to a low-level state; pulling down, by a pull-down module, a signal of an output terminal of the shift register to the low-level state under control of the signal of the pull-down control node; and in a second phase, pulling up, by the pull-up module using its own bootstrap effect, a signal of the pull-up control node to the high-level state; and pulling up, by the pull-up module, the signal of the output terminal of the shift register unit to the high-level state under control of the signal of the pull-up control node and a signal of a second clock signal terminal.

According to a third aspect of the present disclosure, there is provided a display device, comprising multiple stages of shift register units as described above.

In the shift register unit, the driving method thereof and the display device provided in the embodiments of the present disclosure, the shift register unit comprises the input module, the pull-down compensation module, the pull-up module and the pull-down module. Compared with the shift register unit in the prior art of which the signal output by the shift register unit is distorted seriously under the condition of instability, high temperature or low temperature in the manufacturing process, the pull-down compensation module in the embodiment of the present disclosure is capable of pulling down at least twice the signal of the pull-down control node when the pull-up control node is in the high-level state, so as to ensure that the pull-down control node is pulled down to the low-level state. Under the condition of instability, high temperature or low temperature in the manufacturing process, it is also capable of guaranteeing the accuracy of the signal of the pull-down control node, and reducing influence on signals transmitted in the shift register unit caused by such situations as instability, high temperature and low temperature in the manufacturing process, so that the display effect of the display device is improved.

BRIEF DESCRIPTION OF THE DRAWINGS

Figures described below are used to provide further understanding of the present disclosure, and form a part of the present disclosure. In the figures.

DETAILED DESCRIPTION

In order to further describe a shift register unit, a driving method thereof and a display device provided in embodiments of the present disclosure, detailed descriptions are provided below by combining with figures of the specification. Exemplary embodiments of the present disclosure and their descriptions are used to explain the present disclosure, and do not form a limitation to the present disclosure.

Figure 1:
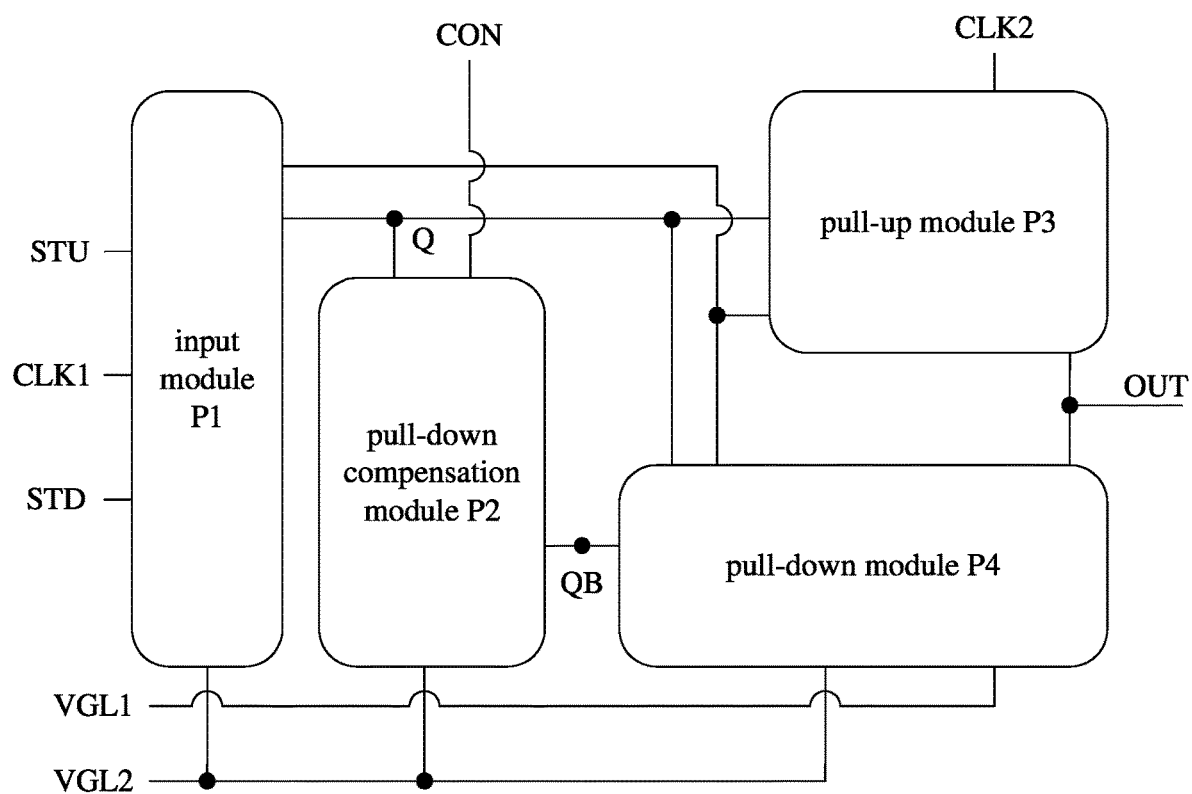
FIG. 1 is a structure schematic diagram of a shift register unit in a first embodiment of the present disclosure.

FIG. 1 shows a structure schematic diagram of a shift register unit in a first embodiment of the present disclosure.

By referring to FIG. 1, the shift register unit provided in the embodiment of the present disclosure comprises an input module P1, a pull-down compensation module P2, a pull-up module P3, and a pull-down module P4. Herein, the input module P1 is connected to a trigger signal terminal STU, a pull-down signal terminal STD, a first clock signal terminal CLK1, a low level terminal VGL, the pull-down module P4, the pull-up module P3 and a pull-up control node Q. The pull-up control node Q is a connection node of the input module P1, the pull-down compensation module P2, the pull-up module P3 and the pull-down module P4. The input module P1 is configured to transmit a signal of the trigger signal terminal STU or a signal of the low level terminal VGL to the pull-up control node Q under control of the signal of the trigger signal terminal STU, a signal of the first clock signal terminal CLK1 and a signal of the pull-down signal terminal STD. The pull-down compensation module P2 is connected to a control signal terminal CON, the pull-up control node Q, a pull-down control node QB and the low level terminal VGL. The pull-down control node QB is a connection node of the pull-down compensation module P2 and the pull-down module P4. The pull-down compensation module P2 is configured to pull down at least twice a signal of the pull-down control node QB when a signal of the pull-up control node Q is in a high-level state, so that the signal of the pull-down control node QB is pulled down to a low-level state. The pull-up module P3 is connected to a second clock signal terminal CLK2, the pull-down module P4, the pull-up control node Q and an output terminal OUT of the shift register unit. The pull-up module P3 is configured to pull up a signal of the output terminal OUT of the shift register unit to the high-level state under control of the signal of the pull-up control node Q and a signal of the second clock signal terminal CLK2, and pull up the signal of the pull-up control node Q to the high-level state by using its own bootstrap effect. The pull-down module P4 is connected to the input module P1, the pull-up module P3, the pull-up control node Q, the pull-down control node QB, the low level terminal VGL and the output terminal OUT of the shift register unit. The pull-down module P4 is configured to pull down the signal of the output terminal of the shift register to the low-level state under control of the signal of the pull-down control node QB.

Relevant description will be given below to the driving method of the shift register unit by combining with the shift register unit described above. The driving method of the shift register unit comprises following operation processes:

In a first phase, the input module P1 receives the signal of the trigger signal terminal STU, the signal of the first clock signal terminal CLK1 and the signal of the pull-down signal terminal STD, and transmits the signal of the trigger signal terminal STU or the signal of the low level terminal VGL to the pull-up control node Q under control of the signal of the trigger signal terminal STU, the signal of the first clock signal terminal CLK1 and the signal of the pull-down signal terminal STD; the pull-down compensation module P2 pulls down the signal of the pull-down control node QB when the pull-up control node Q is in the high-level state, for example, conducting the pull-down operation at least twice, so that the signal of the pull-down control node QB is pulled down to the low-level state; and the pull-down module P4 pulls down the signal of the output terminal of the shift register to the low-level state under control of the signal of the pull-down control node QB.

In a second phase, the pull-up module P3 pulls up the signal of the pull-up control node Q to the high-level state by using its own bootstrap effect; and the pull-up module P3 pulls up the signal of the output terminal OUT of the shift register unit to the high-level state under control of the signal of the pull-up control node Q and the signal of the second clock signal terminal CLK2.

It should be noted that the first phase and the second phase of the driving method are mainly related with signal timings of respective signal terminals (such as the trigger signal terminal STU, the pull-down signal terminal STD, the first clock signal terminal CLK1, and the second cock signal terminal CLK2), but they do not have certain chronological order.

In the shift register unit and the driving method thereof provided in the embodiments of the present disclosure, the shift register unit comprises the input module P1, the pull-down compensation module P2, the pull-up module P3 and the pull-down module P4. Compared with the shift register unit in the prior art of which the signal output by the shift register unit is distorted seriously under the condition of instability, high temperature or low temperature in the manufacturing process, the pull-down compensation module P2 in the embodiment of the present disclosure is capable of conducting pull-down twice at a minimum on the signal of the pull-down control node QB when the pull-up control node Q is in the high-level state, so as to ensure that the pull-down control node QB is pulled down to the low-level state. Under the condition of instability, high temperature or low temperature in the manufacturing process, it is also capable of guaranteeing accuracy of the signal of the pull-down control node QB, and reducing influence on signals transmitted in the shift register unit caused by such situations as instability, thigh temperature and low temperature in the manufacturing process, so that the display effect of the display device is improved.

Figure 2:
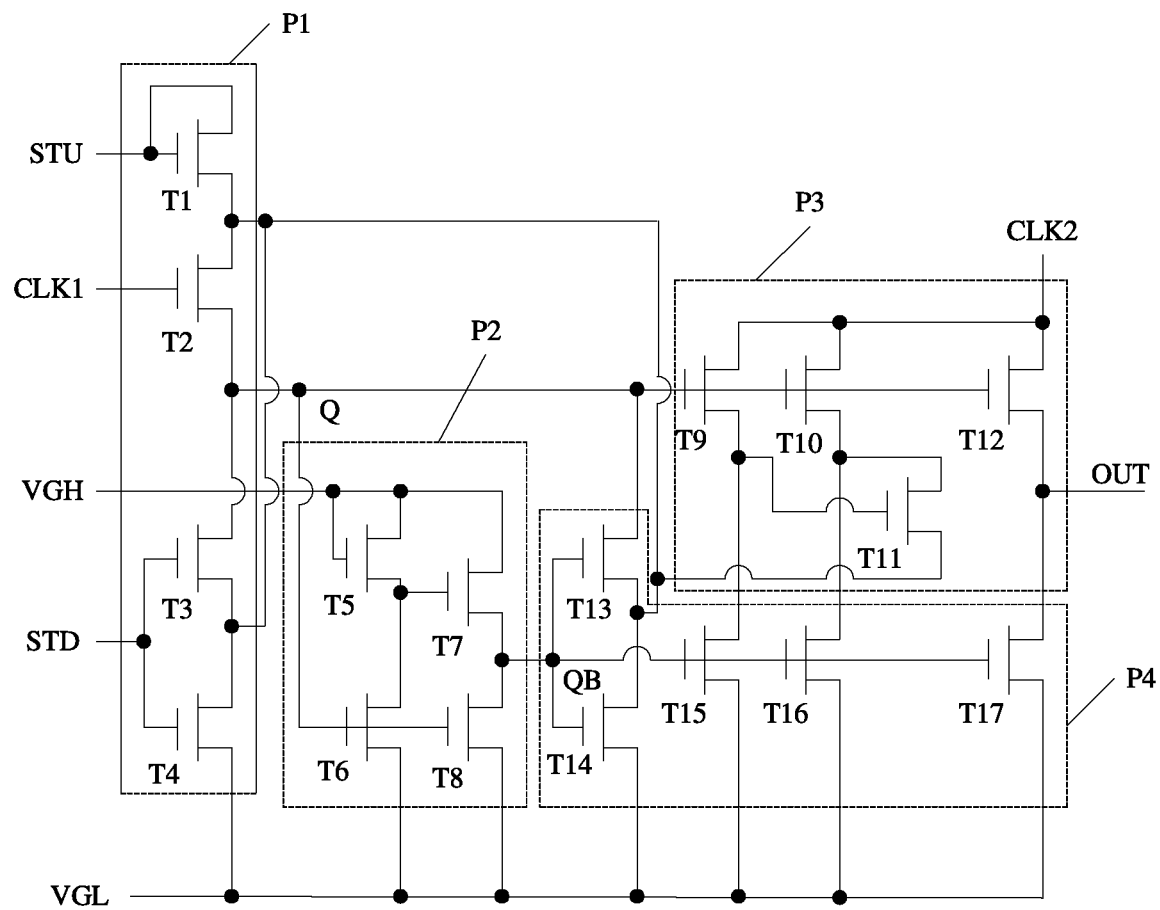
FIG. 2 is a structure schematic diagram of a shift register unit in a second embodiment of the present disclosure.

FIG. 2 shows a structure schematic diagram of a shift register unit in a second embodiment of the present disclosure.

By referring to FIG. 2, specific structures of the input module P1, the pull-down compensation module P2, the pull-up module P3 and the pull-down module P4 in the first embodiment will be described below in detail by taking examples. In these examples, the control signal terminal CON is a high level terminal VGH.

As shown in FIG. 2, the input module P1 comprises a first transistor T1, a second transistor T2, a third transistor T3 and a fourth transistor T4. A gate of the first transistor T1 is connected to the trigger signal terminal STU, a source thereof is connected to a drain of the second transistor T2, a source of the third transistor T3 and a drain of the fourth transistor T4, and a drain thereof is connected to the trigger signal terminal STU. A gate of the second transistor T2 is connected to the first clock signal terminal CLK1, a source thereof is connected to a drain of the third transistor T3 and the pull-up control node Q, and a drain thereof is connected to the source of the third transistor T3, the drain of the fourth transistor T4, the pull-up module P3 and the pull-up module P4. A gate of the third transistor T3 is connected to the pull-down signal terminal STD, the source thereof is connected to the drain of the fourth transistor T4, the pull-up module P3 and the pull-down module P4, and the drain thereof is connected to the pull-up control node Q. A gate of the fourth transistor T4 is connected to the pull-down signal terminal STD, a source thereof is connected to the low level terminal VGL, and the drain thereof is connected to the pull-up module P3 and the pull-down module P4.

The pull-down compensation module P2 comprises fifth transistor T5, a sixth transistor T6, a seventh transistor T7 and an eighth transistor T8. A gate of the fifth transistor T5 is connected to the high level terminal VGH, a source thereof is connected to a drain of the sixth transistor T6 and a gate of the seventh transistor T7, and a drain thereof is connected to the high level terminal VGH. A gate of the sixth transistor T6 is connected to the pull-up control node Q, a source thereof is connected to the low level terminal VGL, and the drain thereof is connected to a gate of the seventh transistor T7. A source of the seventh transistor T7 is connected to the pull-down control node QB, and a drain thereof is connected to the high level terminal VGH. A gate of the eighth transistor T8 is connected to the pull-up control node Q, a source thereof is connected to the low level terminal VGL, and a drain thereof is connected to the pull-down control node QB. It should be noted that when the signal of the pull-up control node Q is in the high-level state, the fifth transistor T5 and the sixth transistor T6 conduct pull-down on the signal of the pull-down control node QB for the first time, and the seventh transistor T7 and the eighth transistor T8 conduct pull-down on the signal of the pull-down control node QB for the second time. Alternatively, the pull-down compensation module P2 can further comprise more number of transistors, so as to conduct pull-down on the signal of the pull-down control node QB for more times. However, the scenario in the present embodiment is that the pull-down compensation module comprises four transistors, and these four transistors conduct pull-down twice on the signal of the pull-down control node QB.

The pull-up module P3 comprises a ninth transistor T9, a tenth transistor T10, an eleventh transistor T11 and a twelfth transistor T12. A gate of the ninth transistor T9 is connected to the pull-up control node Q, a source thereof is connected to a gate of the eleventh transistor T11 and the pull-down module P4, and a drain thereof is connected to the second clock signal terminal CLK2. A gate of the tenth transistor T10 is connected to the pull-up control node Q, a source thereof is connected to a drain of the eleventh transistor T11 and the pull-down module P4, and a drain thereof is connected to the second clock signal terminal CLK2. The gate of the eleventh transistor T11 is connected to the pull-down module P4, a source thereof is connected to the source of the first transistor T1 and pull-down module P4, and the drain thereof is connected to the pull-down module P4. A gate of the twelfth transistor T12 is connected to the pull-up control node Q, a source thereof is connected to the output terminal OUT of the shift register unit, and a drain thereof is connected to the second clock signal terminal CLK2.

The pull-down module P4 comprises a thirteenth transistor T13, a fourteenth transistor T14, a fifteenth transistor T15, a sixteenth transistor T16 and a seventeenth transistor T17. A gate of the thirteenth transistor T13 is connected to the pull-down control node QB, a source thereof is connected to a drain of the fourteenth transistor T14, the source of the eleventh transistor T11 and the source of the first transistor T1, and a drain thereof is connected to the pull-up control node Q. A gate of the fourteenth transistor T14 is connected to the pull-down control node QB, a source thereof is connected to the low level terminal VGL, and a drain thereof is connected to the source of the eleventh transistor T11 and the source of the first transistor T1. A gate of the fifteenth transistor T15 is connected to the pull-down control node QB, a source thereof is connected to the low level terminal VGL, and the drain thereof is connected to the source of the ninth transistor T9 and the gate of the eleventh transistor T11. A gate of the sixteenth transistor T16 is connected to the pull-down control node QB, a source thereof is connected to the low level terminal VGL, and a drain thereof is connected to the source of tenth transistor T10 and the drain of the eleventh transistor T11. A gate of the seventeenth transistor T17 is connected to the pull-down control node QB, a source thereof is connected to the low level terminal VGL, and a drain thereof is connected to the output terminal OUT of the shift register unit.

It should be noted that the pull-up control node Q is a connection node of the source of the second transistor T2, the drain of the third transistor T3, the gate of the sixth transistor T6, the gate of the eighth transistor T8, the gate of the ninth transistor T9, the gate of the tenth transistor T10, the gate of the twelfth transistor T12 and the drain of the thirteen transistor T13; and the pull-down control node QB is a connection node of the source of the seventh transistor T7, the drain of the eighth transistor T8, the gate of the thirteenth transistor T13, the gate of the fourteenth transistor T14, the gate of the fifteenth transistor T15, the gate of the sixteenth transistor T16 and the gate of the seventeenth transistor T17.

Figure 3:
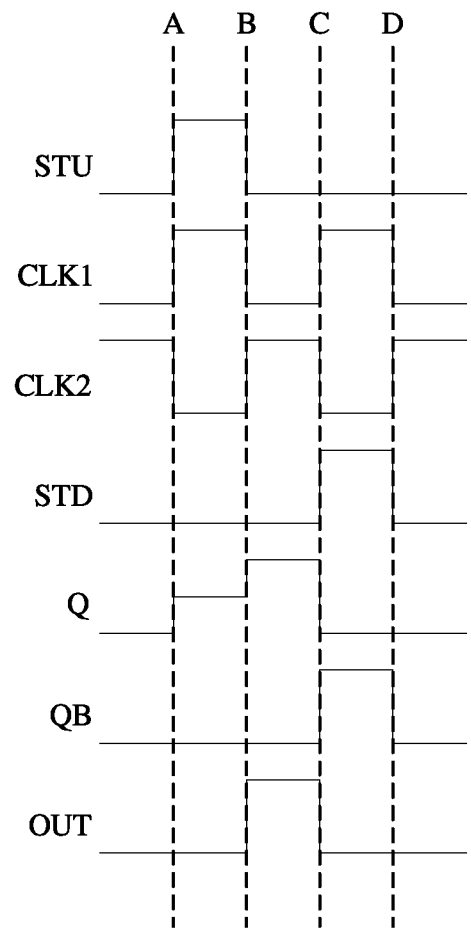
FIG. 3 is a signal timing diagram corresponding to the shift register unit in FIGS. 2, 4, 7, and 8.

FIG. 3 shows a signal timing diagram corresponding to the shift register unit in FIG. 2.

The driving method of the shift register unit as shown in FIG. 2 will be described below by referring to FIG. 3 by taking the respective transistors being N type transistors as an example.

As shown in FIG. 3, in periods of time A-B, both the signal of the trigger signal terminal STU and the signal of the first clock signal terminal CLK1 are in the high-level state, both the signal of the pull-down signal terminal STD and the signal of the second clock signal terminal CLK2 are in the low-level state, and the gate of the first transistor T1 receives the signal of the trigger signal terminal STU, so that the first transistor T1 is turned on; the gate of the second transistor T2 receives the signal of the first clock signal terminal CLK1, and the second transistor T2 is turned on; the gate of the third transistor T3 and the gate of the fourth transistor T4 receive the signal of the pull-down signal terminal STD, and both the third transistor T3 and the fourth transistor T4 are turned off, and the pull-up control node Q receives the signal of the trigger signal terminal STU transmitted by the first transistor T1 and the second transistor T2; the gate of the fifth transistor T5 receives the high level signal of the high level terminal VGH, and the fifth transistor T5 is turned on; the gate of the seventh transistor T7 receives the high level signal of the high level terminal VGH transmitted by the fifth transistor T5, and the seventh transistor T7; the gate of the sixth transistor T6 and the gate of the eighth transistor T8 receive the signal of the pull-up control node Q, and the sixth transistor T6 and the eighth transistor T8 are turned on to pull down the signal of the pull-down control node QB to the low-level state; the gate of the thirteen transistor T13, the gate of the fourteenth transistor T14, the gate of the fifteenth transistor T15, the gate of the sixteenth transistor T16 and the gate of the seventeenth transistor T17 receive the signal of the pull-down control signal QB, and the thirteenth transistor T13, the fourteenth transistor T14, the fifteenth transistor T15, the sixteenth transistor T16 and the seventeenth transistor T17 are turned off; the gate of the ninth transistor T9, the gate of the tenth transistor T10 and the gate of the twelfth transistor T12 receive the signal of the pull-up control node Q, and the ninth transistor T9, the tenth transistor T10 and the twelfth transistor T12 are turned on; and the twelfth transistor T12 transmits the signal of the second clock signal terminal CLK2 to the output terminal of the shift register to pull down the signal of the output terminal of the shift register to the low-level state.

In periods of time B-C, both the signal of the trigger signal terminal STU and the signal of the first clock signal terminal CLK1 are in the low-level state, both the signal of the pull-down signal terminal STD and the signal of the second clock signal terminal CLK2 are in the high-level state, and the gate of the first transistor T1 receives the signal of trigger signal terminal STU, so that the first transistor T1 is turned off; the gate of the second transistor T2 receives the signal of the first clock signal terminal CLK1, and the second transistor T2 is turned off; the gate of the third transistor T3 and the gate of the fourth transistor T4 receive the signal of the pull-down signal terminal STD, and the third transistor T3 and the fourth transistor T4 are turned on; capacitors of the ninth transistor T9, the tenth transistor T10 and the twelfth transistor T12 produce a bootstrap phenomenon, so that the signal of the pull-up control node Q is pulled up to the high-level state; the gate of the fifth transistor T5 receives the high level signal of the high level terminal VGH, and the fifth transistor T5 is turned on; the gate of the seventh transistor T7 receives the high level signal of the high level terminal VGH transmitted by the fifth transistor T5, and the seventh transistor T7 is turned on; the gate of the sixth transistor T6 and the gate of the eighth transistor T8 receive the signal of the pull-up control node Q, and the sixth transistor T6 and the eighth transistor T8 are turned on to pull down the signal of the pull-down control node QB to the low-level state; the gate of the thirteen transistor T13, the gate of the fourteenth transistor T14, the gate of the fifth transistor T15, the gate of the sixteenth transistor T16 and the gate of the seventeenth transistor T17 receive the signal of the pull-down control node QB, and the thirteenth transistor T13, the fourteenth transistor T14, the fifteenth transistor T15, the sixteenth transistor T16 and the seventeenth transistor T17 are turned off; the gate of the ninth transistor T9, the gate of the tenth transistor T10 and the gate of the twelfth transistor T12 receive the signal of the pull-up control node Q such that the ninth transistor T9, the tenth transistor T10 and the twelfth transistor T12 are turned on, and the twelfth transistor T12 transmits the signal of the second clock signal terminal CLK2 to the output terminal OUT of the shift register unit to pull up the signal of the output terminal OUT of the shift register unit to the high-level state.

In periods of time C-D, the signal of the trigger signal terminal STU and the signal of the second clock signal terminal CLK2 are in the low-level state, the signal of the pull-down signal terminal STD and the signal of the first clock signal terminal CLK1 are in the high-level state, and the gate of the first transistor T1 receives the signal of the trigger signal terminal STU, so that the first transistor T1 is turned off; the gate of the second transistor T2 receives the signal of the first clock signal terminal CLK1, and the second transistor T2 is turned on; the gate of the third transistor T3 and the gate of the fourth transistor T4 receive the signal of the pull-down signal terminal STD, and both the third transistor T3 and the fourth transistor T4 are turned on; the pull-up control node Q receives the low level signal of the low level terminal VGL transmitted by the third transistor T3 and the fourth transistor T4; the gate of the fifth transistor T5 receives the high level signal of the high level terminal VGH, and the fifth transistor T5 is turned on; the gate of the seventh transistor T7 receives the high level signal of the high level terminal VGH transmitted by the fifth transistor T5, and the seventh transistor T7 is turned on; the gate of the sixth transistor T6 and the gate of the eighth transistor T8 receive the signal of the pull-up control node Q, and the sixth transistor T6 and the eighth transistor T8 are turned off; the pull-down control node QB receives the high level signal of the high level terminal VGH transmitted by the seventh transistor T7; the gate of the ninth transistor T9, the gate of the tenth transistor T10 and the gate of the twelfth transistor T12 receive the signal of the pull-up control node Q, and the ninth transistor T9, the tenth transistor T10 and the twelfth transistor T12 are turned off; the gate of the thirteenth transistor T13, the gate of the fourteenth transistor T14, the gate of the fifteenth transistor T15, the gate of the sixteenth transistor T16 and the gate of the seventeen transistor T17 receive the signal of the pull-down control node QB, so that the thirteenth transistor T13, the fourteenth transistor T14, the fifteenth transistor T15, the sixth transistor T16 and the seventeenth transistor T17 are turned on, and the seventeenth transistor T17 transmits the low level signal of the low level terminal VGL to the output terminal OUT of the shift register unit to pull down the output terminal OUT of the shift register unit to the low-level state.

Figure 4:
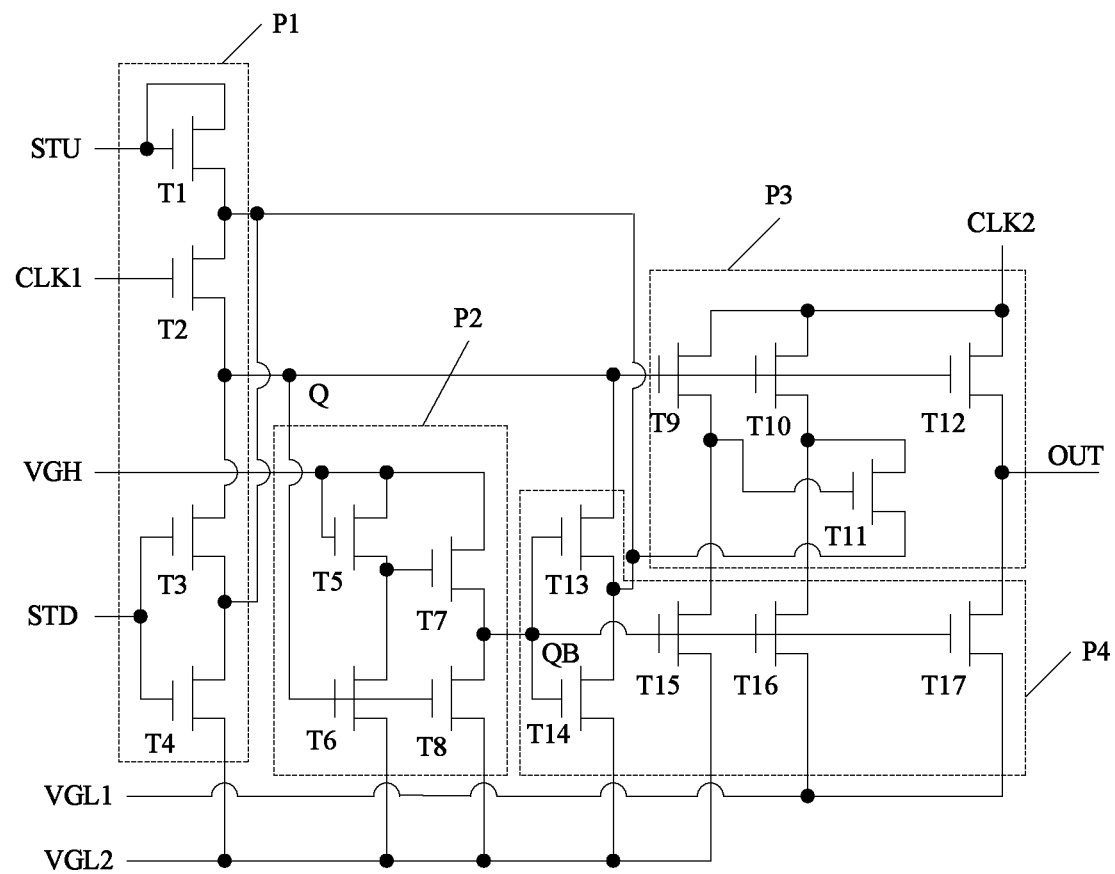
FIG. 4 is another structure schematic diagram of the shift register unit in the second embodiment of the present disclosure.

FIG. 4 shows another structure schematic diagram of a shift register unit in the second embodiment of the present disclosure.

Referring to FIG. 4, alternatively, the low level terminal VGL can comprise a first low level terminal VGL1 and a second low level terminal VGL2. The source of the fourth transistor T4, the source of the sixth transistor T6, the source of the eighth transistor T8, the source of the fourteenth transistor T14 and the source of the fifteenth transistor T15 are connected to the second low level terminal VGL2, and the source of the sixteenth transistor T16 and the source of the seventeenth transistor T17 are connected to the low first low level terminal VGL1. Herein, a voltage of signal of the first low level terminal VGL1 is higher than a voltage of a signal of the second low level terminal VGL2, for example, the voltage of the signal of the first low level terminal VGL1 is −5V, and the voltage of the signal of the second low level terminal VGL2 is −10V. Since the signal of the pull-up control node Q is in the low-level state, the sixth transistor T6 and the eighth transistor T8 are turned off, such that the signal of the pull-down control node QB is in the high-level state, the thirteenth transistor T13, the fourteenth transistor T14, the fifteenth transistor T15, the sixteenth transistor T16 and the seventeenth transistor T17 are turned on, the pull-up control node Q is discharged to the low-level state as the same as the signal of the second low level terminal VGL2, and both the source of the tenth transistor T10 and the source of the twelfth transistor T12 are pulled down to the low-level state as the same as the signal of the first low level terminal VGL1, so as to ensure that a voltage between the gate and the source of the tenth transistor T10 and the twelfth transistor T12 is smaller than zero, and further ensure that the tenth transistor T10 and the twelfth transistor T12 are turned off, which raises the accuracy of signal transmission in the shift register unit, and further improves display effect of the display device. The driving method of the shift register unit as shown in FIG. 4 is consistent with the driving method of the shift register as shown in FIG. 3, and thus no further details are given herein.

Figure 5:
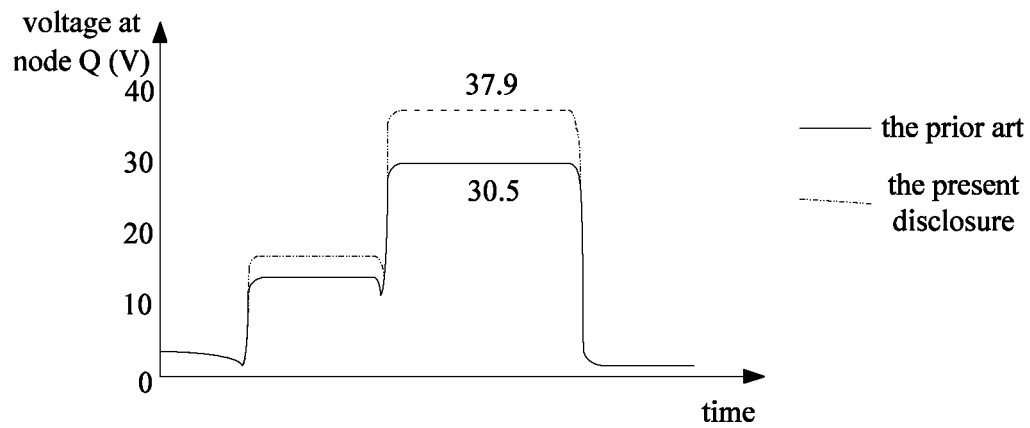
FIG. 5 is a comparison diagram of a permitted voltage of pull-up control nodes of a shift register unit in the present disclosure and a shift register unit in the prior art.
Figure 6:
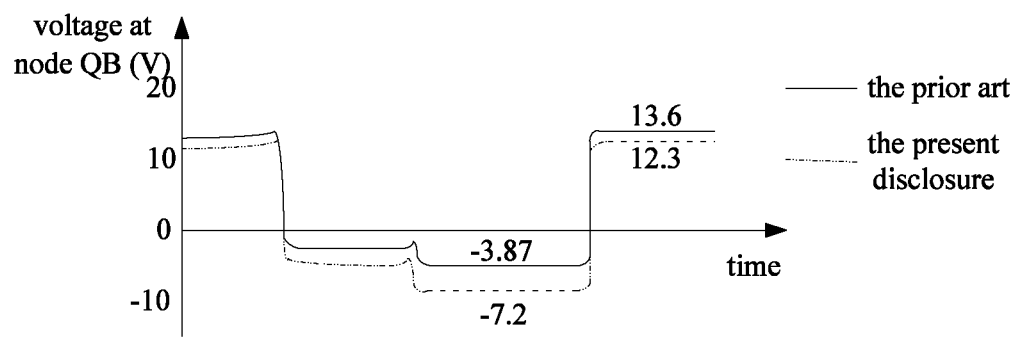
FIG. 6 is a comparison diagram of a permitted voltage of pull-down control nodes of a shift register unit in the present disclosure and a shift register unit in the prior art.

FIGS. 5 and 6 show respectively the permitted voltage comparison diagrams of pull-up control nodes and pull-down control nodes in the shift register unit provided in the embodiment of the present disclosure and the shift register unit in the prior art;

Please refer to FIGS. 5 and 6 in the following description. It can be seen from the permitted voltage comparison diagram of the pull-up control node in FIG. 5 that by using the shift register unit in the prior art, when the voltage of the pull-up control node Q exceeds 30.5V, the signal output by the shift register unit is distorted seriously, or even the signal cannot be output; however, by using the shift register unit in the embodiment of the present disclosure, when the voltage of the pull-up control node Q exceeds 37.9V, the scenario of serious distortion or the scenario that the signal cannot be output would be likely to occur to the signal output by the shift register unit. Likewise, it can be seen from the permitted voltage comparison diagram of the pull-down control node in FIG. 6 that by using the shift register unit in the prior art, when the voltage of the pull-down control node QB is lower than −3.87V, the signal output by the shift register unit is distorted seriously, or even the signal cannot be output; however, by using the shift register unit in the embodiment of the present disclosure, when the voltage of the pull-down control node QB is lower than −7.2V, the scenario of serious distortion or the scenario that the signal cannot be output would be likely to occur to the signal output by the shift register unit. The shift register unit in the embodiment of the present disclosure enlarges the scope that permits the threshold voltage of the thin film transistor to vary, so as to reduce influence on signals transmitted in a shift register unit caused by such situations as instability, high temperature and low temperature in the manufacturing process, so that the display effect of the display device is improved.

Figure 7:
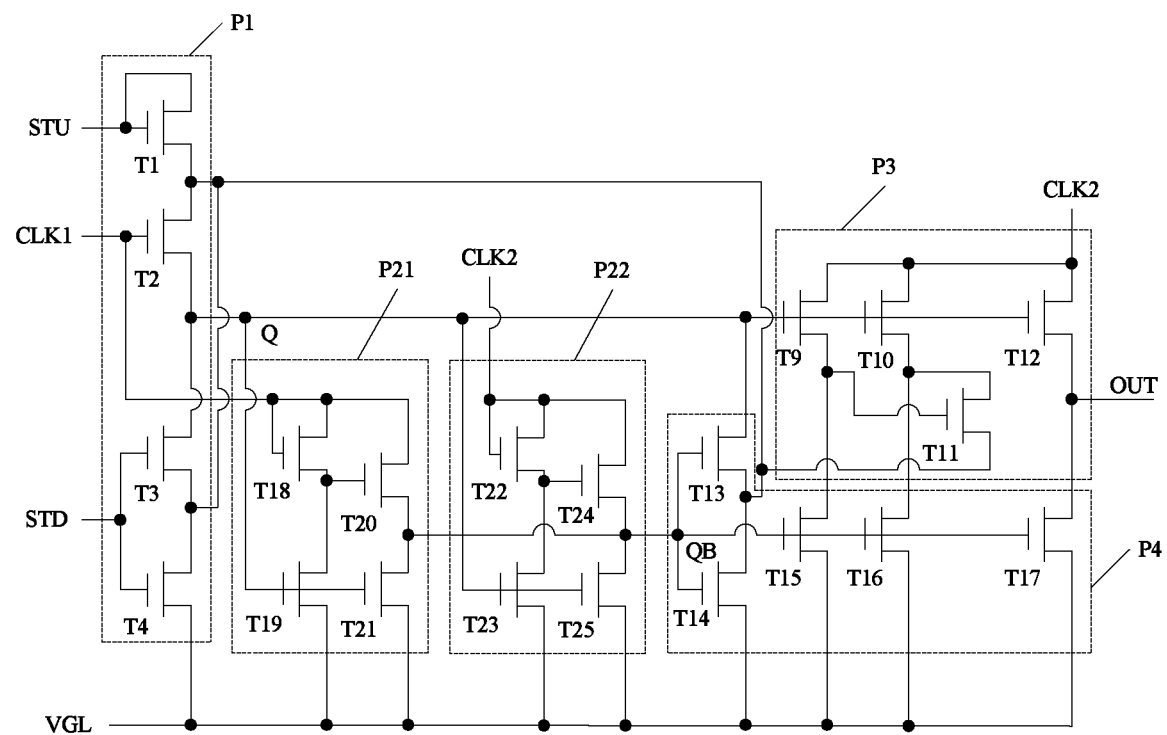
FIG. 7 is a structure schematic diagram of a shift register unit in a third embodiment of the present disclosure.

FIG. 7 shows a structure schematic diagram of a shift register unit in a third embodiment of the present disclosure.

Referring to FIG. 7, alternatively, in the present embodiment, the control signal terminal CON can comprise the first clock signal terminal CLK1 and the second clock signal terminal CLK2, and the pull-down compensation module P2 can further be implemented by another circuit structure, and description will be given below in detail.

As shown in FIG. 7, the pull-down compensation module P2 can comprise a first pull-down compensation sub-module P21 and a second pull-down compensation sub-module P22. The first pull-down compensation sub-module P21 and the second pull-down compensation sub-module P22 are used for conducting pull-down at least twice on the signal of the pull-down control node QB alternatively when the pull-up control node Q is in the high-level state, so that the signal of the pull-down control node QB is pulled down to the low-level state. For example, the first pull-down compensation sub-module P21 comprises an eighteenth transistor T18, a ninth transistor T19, a twentieth transistor T20 and a twenty-first transistor T21. Herein, a gate of the eighteenth transistor T18 is connected to the first clock signal terminal CLK1, a source thereof is connected to a drain of the nineteenth transistor T19 and a gate of the twentieth transistor T20, and a drain thereof is connected to the first clock signal terminal CLK1. A gate of the nineteenth transistor T19 is connected to the pull-up control node Q, a source thereof is connected to the low level terminal VGL, and the drain thereof is connected to the gate of the twentieth transistor T20. A source of the twentieth transistor T20 is connected to the pull-down control node QB, and a drain thereof is connected to the first clock signal terminal CLK1. A gate of the twenty-first transistor T21 is connected to the pull-up control node Q, a source thereof is connected to the low level terminal VGL, and a drain thereof is connected to the pull-down control node QB. The second pull-down compensation sub-module P22 comprises a twenty-second transistor T22, a twenty-third transistor T23, a twenty-fourth transistor T24 and a twenty-fifth transistor T25. Herein, a gate of the twenty-second transistor T22 is connected to the second clock signal terminal CLK2, a source thereof is connected to a drain of the twenty-third transistor T23 and a gate of the twenty-fourth transistor T24, and a drain thereof is connected to the second clock signal terminal CLK22. A gate of the twenty-third transistor T23 is connected to the pull-up control node Q, a source thereof is connected to the low level terminal VGL, and the drain thereof is connected to the gate of the twenty-fourth transistor T24. A source of the twenty-fourth transistor T24 is connected to the pull-down control node QB, and a drain thereof is connected to the second clock signal terminal CLK2. A gate of the twenty-fifth transistor T25 is connected to the pull-up control node Q, a source thereof is connected to the low level terminal VGL, and a drain thereof is connected to the pull-down control node QB. In the circuit as shown in FIG. 7, optionally, the signal of the first clock signal terminal CLK1 and the signal of the second clock signal terminal CLK2 can be signals having inverted phases. Therefore, the first pull-down compensation sub-module P21 under control of the signal of the first clock signal terminal CLK1 and the second pull-down compensation sub-module P22 under control of the signal of the second clock signal terminal CLK22 conduct pull-down at least twice on the signal of the pull-down control node QB alternatively. It should be noted that both the first pull-down compensation sub-module P21 and the second pull-down compensation sub-module P22 can comprise more number of transistors, so as to conduct pull-down at least twice on the pull-down control node QB. However the situation in the embodiment is that both the first pull-down compensation sub-module P21 and the second pull-down compensation sub-module P22 comprise four transistors, and the respective four transistors of the first pull-down compensation sub-module P21 and the second pull-down compensation sub-module P22 conduct pull-down twice on the pull-down control node QB alternatively.

The driving method of the shift register unit as shown in FIG. 7 will be described below by taking the respective transistors being N type transistors as an example. The signal timing diagram as shown in FIG. 3 is also applicable to the shift register unit as shown in FIG. 7.

In periods of time A-B, both the signal of the trigger signal terminal STU and the signal of the first clock signal terminal CLK1 are in the high-level state, the signal of the pull-down signal terminal SDT and the signal of the second clock signal terminal CLK2 are in the low-level state, the gate of the first transistor T1 receives the signal of the trigger signal terminal STU, and the first transistor T1 is turned on; the gate of the second transistor T2 receives the signal of the first clock signal terminal CLK1, and the second transistor T2 is turned on; the gate of the third transistor T3 and the gate of the fourth transistor T4 receive the signal of the pull-down signal terminal STD, both the third transistor T3 and the fourth transistor T4 are turned off, and the pull-up control node Q receive the signal of the trigger signal terminal STU transmitted by the first transistor T1 and the second transistor T2; the gate of the eighteenth transistor T18 receives the signal of the first clock signal terminal CLK1, and the eighteenth transistor T18 is turned on; the gate of the twentieth transistor 20 receives the signal of the first clock signal terminal CLK1 transmitted by the eighteenth transistor T18, and the twentieth transistor T20 is turned on; the gate of the nineteenth transistor T19 and the gate of the twenty-first transistor T21 receive the signal of the pull-up control node Q, and the nineteenth transistor T19 and the twenty-first transistor T21 are turned on to pull down the signal of the pull-down control node QB to the low-level state; the gate of the twenty-second transistor T22 receives the signal of the second clock signal terminal CLK2, and the twenty-second transistor T22 is turned off, and at this time, the second pull-down compensation sub-module P22 is in a standby state; the gate of the thirteen transistor T13, the gate of the fourteenth transistor T14, the gate of the fifteenth transistor T15, the gate of the sixteenth transistor T16 and the gate of the seventeenth transistor T17 receive the signal of the pull-down control node QB, and the thirteen transistor T13, the fourteenth transistor T14, the fifteenth transistor T15, the sixteenth transistor T16 and the seventeenth transistor T17 are turned off; the gate of the ninth transistor T9, the gate of the tenth transistor T10 and the gate of the twelfth transistor T12 receive the signal of the pull-up control node Q, and the ninth transistor T9, the tenth transistor T10 and the twelfth transistor T12 are turned on; and the twelfth transistor T12 transmits the signal of the second clock signal terminal CLK2 to the output terminal OUT of the shift register unit, so that the signal of the output terminal OUT of the shift register unit is pulled down to the low-level state.

In periods of time B-C, both the signal of the trigger signal terminal STU and the signal of the first clock signal terminal CLK1 are in the low-level state, both the signal of the pull-down signal terminal STD and the signal of the second clock signal terminal CLK2 are in the high-level state, the gate of the first transistor T1 receives the signal of the trigger signal terminal STU, and the first transistor T1 is turned off; the gate of the second transistor T2 receives the signal of the first clock signal terminal CLK1, and the second transistor T2 is turned off; the gate of the third transistor T3 and the gate of the fourth transistor T4 receive the signal of the pull-down signal terminal STD, and the third transistor T3 and the fourth transistor T4 are turned on; capacitances of the ninth transistor T9, the tenth transistor T10 and the twelfth transistor T12 produce a bootstrap phenomenon so that the signal of the pull-up control node Q is pulled up to the high-level state; the gate of the twenty-second transistor T22 receives the signal of the second clock signal terminal CLK2, and the twenty-second transistor T22 is turned on; the gate of the twenty-fourth transistor T24 receives the signal of the second clock signal terminal CLK2 transmitted through the twenty-second transistor T22, and the twenty-fourth transistor T24 is turned on; the gate of the twenty-third transistor T23 and the gate of the twenty-fifth transistor T25 receive the signal of the pull-up control node Q, and the twenty-third transistor T23 and the twenty-fifth transistor T125 are turned on such that the signal of the pull-down control node QB is pulled down to the low-level state; the gate of the eighteenth transistor T18 receives the signal of the first clock signal terminal CLK1, the eighteenth transistor T18 is turned off, and the first pull-down compensation sub-module P21 is in a stand-by state; the gate of the thirteenth transistor T13, the gate of the fourteenth transistor T14, the gate of the fifteenth transistor T15, the gate of the sixteenth transistor T16 and the gate of the seventeenth transistor T17 receive the signal of the pull-down control node QB, and the thirteenth transistor T13, the fourteenth transistor T14, the fifteenth transistor T15, the sixteenth transistor T16 and the seventeenth transistor T17 are turned off; the gate of the ninth transistor T9, the gate of the tenth transistor T10 and the gate of the twelfth transistor T12 receive the signal of the pull-up control node Q, and the ninth transistor T9, the tenth transistor T10 and the twelfth transistor T12 are turned on; and the twelfth transistor T12 transmits the signal of the second clock signal terminal CLK2 to the output terminal OUT of the shift register unit, and the signal of the output terminal OUT of the shift register unit is pulled up to the high-level state.

In periods of time C-D, the signal of the trigger signal terminal STU and the signal of the second clock signal terminal CLK2 are in the low-level state, the signal of the pull-down signal terminal STD and the signal of the first clock signal terminal CLK1 are in the high-level state, the gate of the first transistor T1 receives the signal of the trigger signal terminal STU, and the first transistor T1 is turned off; the gate of the second transistor T2 receives the signal of the first clock signal terminal CLK1, and the second transistor T2 is turned on; the gate of the third transistor T3 and the gate of the fourth transistor T4 receive the signal of the pull-down signal terminal STD, and both the third transistor T3 and the fourth transistor 4 are turned on; the pull-up control node Q receives the low level signal of the low level terminal VGL transmitted through the third transistor T3 and the fourth transistor T4; the gate of the eighteenth transistor T18 receives the signal of the first clock signal terminal CLK1, and the eighteenth transistor T18 is turned on; the gate of the twenty transistor T20 receives the signal of the first clock signal terminal CLK1 transmitted through the eighteenth transistor T18, and the twentieth transistor T20 is turned on; the gate of the nineteenth transistor T19 and the gate of the twenty-first transistor T21 receive the signal of the pull-up control node Q, and the nineteenth transistor T19 and the twenty-first transistor T21 are turned off; the pull-down control node QB receives the signal of the first clock signal terminal CLK1 transmitted through the twenty transistor T20; the gate of the twenty-second transistor T22 receives the signal of the second clock signal terminal CLK2, the twenty-second transistor T22 is turned off, and the second pull-down compensation sub-module P22 is in the stand-by state; the gate of the ninth transistor T9, the gate of the tenth transistor T10 and the gate of the twelfth transistor T12 receives the signal of the pull-up control node Q, and the ninth transistor T9, and the tenth transistor T10 and the twelfth transistor T12 are turned off; the gate of the thirteenth transistor T13, the gate of the fourteenth transistor T114, the gate of the fifteenth transistor T15, the gate of the sixteenth transistor T16 and the gate of the seventeenth transistor T17 receive the signal of the pull-down control node QB, the thirteenth transistor T13, the fourteenth transistor T14, the fifteenth transistor T15, the sixteenth transistor T16 and the seventeenth transistor T17 are turned on, and the seventeenth transistor T17 transmits the low level signal of the low level terminal VGL to the output terminal OUT of the shift register unit to pull down the signal of the output terminal OUT of the shift register unit to the low-level state.

Figure 8:
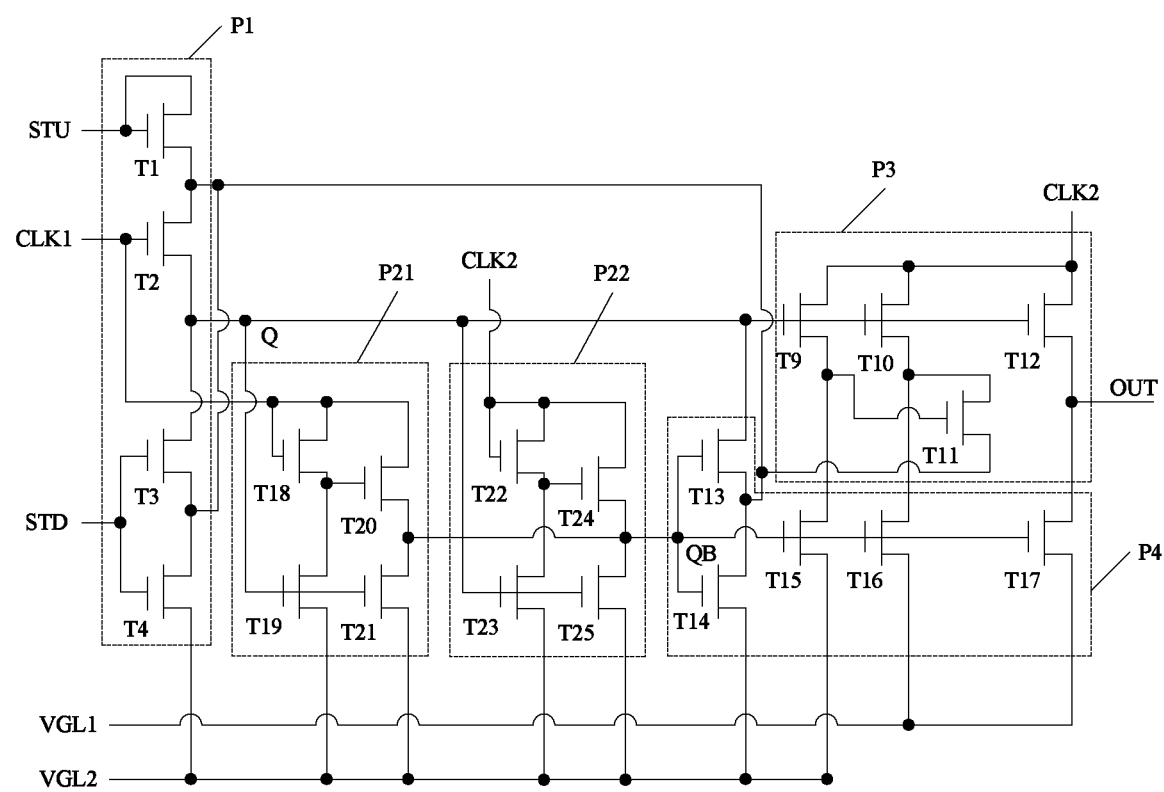
FIG. 8 is another structure schematic diagram of the shift register unit in the third embodiment of the present disclosure.

FIG. 8 shows another structure schematic diagram of a shift register unit in a third embodiment of the present disclosure.

Please referring to FIG. 8, alternatively, the low level terminal VGL can comprise the first low level terminal VGL1 and the second low level terminal VGL2. The source of the nineteenth transistor T19, the source of the twenty-first transistor T21, the source of the twenty-third transistor T23 and the source of the twenty-fifth transistor T25 are connected to the second low level terminal VGL2, and both the source of the sixteenth transistor T16 and the source of the seventeenth transistor T17 are connected to the first low level terminal VGL1. Herein, the voltage of the signal of the first low level terminal VGL1 is higher than the voltage of the signal of the second low level terminal VGL2, for example, the voltage of the signal of the first low level terminal VGL1 is −5V, the voltage of the signal of the second low level terminal VGL2 is −10V. Since when the signal of the pull-up control node Q is in the low-level state, the nineteenth transistor T19, the twenty-first transistor T21, the twenty-third transistor T23 and the twenty-fifth transistor T25 are turned off, the signal of the pull-down control node QB is in the high-level state, the thirteen transistor T13, the fourteenth transistor T14, the fifteenth transistor T15, the sixteenth transistor T16 and the seventeenth transistor T17 are turned off, the pull-up control node Q is discharged to be in the low-level state as the same as the signal of the second low level terminal VGL2, and both the source of the tenth transistor T10 and the source of the twelfth transistor T12 are pull-down to the low-level state as the same as the signal of the first low level terminal VGL1, so as to ensure that the voltage between the gate and source of the tenth transistor T10 and the twelfth transistor T12 is smaller than zero and further ensure that the tenth transistor T10 and the twelfth transistor T12 are turned off, which raises the accuracy of signal transmission in the shift register unit and further improves the display effect of the display device. The driving method of the shift register unit as shown in FIG. 8 is consistent with the driving method of the shift register unit as shown in FIG. 3, and thus no further description is given herein.

There is provided in an embodiment of the present disclosure a display device, comprising multiple stages of shift register units in the above embodiments, and the respective stages of shift register units are connected in cascades sequentially. The shift register units in the display device and the shift register unit in the above embodiments have the same advantages, and thus no further description is give herein. In particular, the display device can be any product or components having the function of displaying, such as a liquid crystal display panel, an electronic paper, a mobile phone, a tablet computer, a television set, a display, a notebook computer, a digital photo frame, a navigator or the like.

The above descriptions are just specific implementations of the present disclosure, but the protection scope of the present disclosure is not limited thereto. Alternations or replacements that can be conceived by any one skilled in the art who is familiar with the present technical field shall be covered within the protection scope of the present disclosure. Therefore, the protection scope of the present disclosure shall e subject to the protection scope of the present claims.

The present application claims the priority of a Chinese patent application No. 201510886307.0 filed on Dec. 4, 2015. Herein, the content disclosed by the Chinese patent application is incorporated in full by reference as a part of the present disclosure.

What is claimed is:

1. A shift register unit, comprising:
   an input module, connected to a trigger signal terminal, a pull-down signal terminal, a first clock signal terminal, a low level terminal and a pull-up control node, and configured to transmit a signal of the trigger signal terminal or a signal of the low level terminal to the pull-up control node under control of the signal of the trigger signal terminal, a signal of the first clock signal terminal and a signal of the pull-down signal terminal;
   a pull-down compensation module, connected to a control signal terminal, the pull-up control node, a pull-down control node and the low level terminal, and configured to pull down a signal of the pull-down control node at least twice when a signal of the pull-up control node is in a high-level state to pull down the signal of the pull-down control node to a low-level state;
   a pull-up module, connected to a second clock signal terminal, the pull-up control node and an output terminal of the shift register unit, and configured to pull up a signal of the output terminal of the shift register unit to the high-level state and pull up the signal of the pull-up control node to the high-level state by its own bootstrap phenomenon under control of the signal of the pull-up control node and a signal of the second clock signal terminal; and
   a pull-down module, connected to the input module, the pull-up module, the pull-up control node, the pull-down control node, the low level terminal and the output terminal of the shift register unit, and configured to pull down the signal of the output terminal of the shift register to the low-level state under control of the signal of the pull-down control node,
   wherein the pull-up control node is a connection node of the input module, the pull-down compensation module, the pull-up module and the pull-down module, and the pull-down control node is a connection node of the pull-down compensation module and the pull-down module.

2. The shift register unit according to claim 1, wherein the input module comprises:
   a first transistor, whose gate is connected to the trigger signal terminal, source is connected to a drain of a second transistor, a source of a third transistor and a drain of a fourth transistor, and drain is connected to the trigger signal terminal;

the second transistor, whose gate is connected to the first clock signal terminal, source is connected to a drain of the third transistor and the pull-up control node, and drain is connected to the source of the third transistor, the drain of the fourth transistor, the pull-up module and the pull-down module;

the third transistor, whose gate is connected to the pull-down signal terminal, source is connected to the drain of the fourth transistor, the pull-up module and the pull-down module, and drain is connected to the pull-up control node; and the fourth transistor, whose gate is connected to the pull-down signal terminal, source is connected to the low level terminal, and drain is connected to the pull-up module and the pull-down module.

3. The shift register unit according to claim 2, wherein the pull-down compensation module comprises:

a fifth transistor, whose gate is connected to the control signal terminal, source is connected to a drain of a sixth transistor and a gate of a seventh transistor, and drain is connected to the control signal terminal;

the sixth transistor, whose gate is connected to the pull-up control node, source is connected to the low level terminal, and drain is connected to the gate of the seventh transistor;

the seventh transistor, whose source is connected to the pull-down control node, and drain is connected to the control signal terminal; and the eighth transistor, whose gate is connected to the pull-up control node, source is connected to the low level terminal, and drain is connected to the pull-down control node.

4. The shift register unit according to claim 3, wherein the pull-up module comprises:

a ninth transistor, whose gate is connected to the pull-up control node, source is connected to a gate of an eleventh transistor and the pull-down module, and drain is connected to the second clock signal terminal;

a tenth transistor, whose gate is connected to the pull-up control node, source is connected to a drain of the eleventh transistor and the pull-down module, and drain is connected to the second clock signal terminal;

the eleventh transistor, whose gate is connected to the pull-down module, source is connected to the source of the first transistor and the pull-down module, and drain is connected to the pull-down module; and a twelfth transistor, whose gate is connected to the pull-up control node, source is connected to the output terminal of the shift register unit, and drain is connected to the second clock signal terminal.

5. The shift register unit according to claim 4, wherein the pull-down module comprises:

a thirteenth transistor, whose gate is connected to the pull-down control node, source is connected to a drain of a fourteenth transistor, the source of the eleventh transistor and the source of the first transistor, and drain is connected to the pull-up control node;

the fourteenth transistor, whose gate is connected to the pull-down control node, source is connected to the low level terminal, and drain is connected to the source of the eleventh transistor and the source of the first transistor;

a fifteenth transistor, whose gate is connected to the pull-down control node, source is connected to the low level terminal, and drain is connected to the source of the ninth transistor and the gate of the eleventh transistor;

a sixteenth transistor, whose gate is connected to the pull-down control node, source is connected to the low level terminal, and drain is connected to the source of the tenth transistor and the drain of the eleventh transistor; and a seventeenth transistor, whose gate is connected to the pull-down control node, source is connected to the low level terminal, and drain is connected to the output terminal of the shift register unit.

6. The shift register unit according to claim 1, wherein the control signal terminal comprises the first clock signal terminal and the second clock signal terminal; the pull-down compensation module comprises a first pull-down compensation sub-module and a second pull-down compensation sub-module which are used for pulling down a signal of the pull-down control node at least twice alternatively when the pull-up control node is in the high-level state to pull down the signal of the pull-down control node to the low-level state.

7. The shift register unit according to claim 6, wherein the first pull-down compensation sub-module comprises:

an eighteenth transistor, whose gate is connected to the first clock signal terminal, source is connected to a drain of a nineteenth transistor and a gate of a twentieth transistor, and drain is connected to the first clock signal terminal;

the nineteenth transistor, whose gate is connected to the pull-up control node, source is connected to the low level terminal, and drain is connected to the gate of the twentieth transistor;

the twentieth transistor, whose source is connected to the pull-down control node, and drain is connected to the first clock signal terminal; and a twenty-first transistor, whose gate is connected to the pull-up control node, source is connected to the low level terminal, and drain is connected to the pull-down control node.

8. The shift register unit according to claim 7, wherein the second pull-down compensation sub-module comprises:

a twenty-second transistor, whose gate is connected to the second clock signal terminal, source is connected to a drain of a twenty-third transistor and a gate of a twenty-fourth transistor, and drain is connected to the second clock signal terminal;

the twenty third transistor, whose gate is connected to the pull-up control node, source is connected to the low level terminal, and drain is connected to a gate of the twenty-fourth transistor;

the twenty-fourth transistor, whose source is connected to the pull-down control node, and drain is connected to the second clock signal terminal; and a twenty-fifth transistor, whose gate is connected to the pull-up control node, source is connected to the low level terminal, and drain is connected to the pull-down control node.

9. The shift register unit according to claim 5, wherein the low level terminal comprises a first low level terminal and a second low level terminal, and a voltage of a signal of the first low level terminal is higher than a voltage of a signal of the second low level terminal; and the source of the fourth transistor, the source of the sixth transistor, the source of the eighth transistor, the source of the fourteenth transistor and the source of the fifteenth transistor are connected to the second low level terminal, and the source of the sixteenth transistor and the source of the seventeenth transistor are connected to the first low level terminal.

10. The shift register unit according to claim 8, wherein the low level terminal comprises a first low level terminal and a second low level terminal, and a voltage of a signal of the first low level terminal is higher than a voltage of a signal of the second low level terminal; and the source of the nineteenth transistor, the source of the twenty-first transistor, the source of the twenty-third transistor and the source of the twenty-fifth transistor are connected to the second low level terminal.

11. A driving method of the shift register unit according to claim 1, comprising:

in a first phase, receiving, by the input module, a signal of the trigger signal terminal, a signal of the first clock signal terminal, and a signal of the pull-down signal terminal, and transmitting the signal of the trigger signal terminal or a signal of the low level terminal to the pull-up control node under control of the signal of the trigger signal terminal, the signal of the first clock signal terminal and the signal of the pull-down signal terminal; pulling down, by the pull-down compensation module, a signal of the pull-down control node when the pull-up control node is in a high-level state to pull down the signal of the pull-down control node to a low-level state; and pulling down, by the pull-down module, a signal of an output terminal of the shift register to the low-level state under control of the signal of the pull-down control node; and in a second phase, pulling up, by the pull-up module using its own bootstrap effect, a signal of the pull-up control node to the high-level state; and pulling up, by the pull-up module, the signal of the output terminal of the shift register unit to the high-level state under control of the signal of the pull-up control node and a signal of the second clock signal terminal.

12. A display device, comprising multiple stages of the shift register units according to claim 1.

13. The display device according to claim 12, wherein the input module comprises:

a first transistor, whose gate is connected to the trigger signal terminal, source is connected to a drain of a second transistor, a source of a third transistor and a drain of a fourth transistor, and drain is connected to the trigger signal terminal;

the second transistor, whose gate is connected to the first clock signal terminal, source is connected to a drain of the third transistor and the pull-up control node, and drain is connected to the source of the third transistor, the drain of the fourth transistor, the pull-up module and the pull-down module;

the third transistor, whose gate is connected to the pull-down signal terminal, source is connected to the drain of the fourth transistor, the pull-up module and the pull-down module, and drain is connected to the pull-up control node; and the fourth transistor, whose gate is connected to the pull-down signal terminal, source is connected to the low level terminal, and drain is connected to the pull-up module and the pull-down module.

14. The display device according to claim 13, wherein the pull-down compensation module comprises:

a fifth transistor, whose gate is connected to the control signal terminal, source is connected to a drain of a sixth transistor and a gate of a seventh transistor, and drain is connected to the control signal terminal;

the sixth transistor, whose gate is connected to the pull-up control node, source is connected to the low level terminal, and drain is connected to the gate of the seventh transistor;

the seventh transistor, whose source is connected to the pull-down control node, and drain is connected to the control signal terminal; and the eighth transistor, whose gate is connected to the pull-up control node, source is connected to the low level terminal, and drain is connected to the pull-down control node.

15. The display device according to claim 14, wherein the pull-up module comprises:

a ninth transistor, whose gate is connected to the pull-up control node, source is connected to a gate of an eleventh transistor and the pull-down module, and drain is connected to the second clock signal terminal;

a tenth transistor, whose gate is connected to the pull-up control node, source is connected to a drain of the eleventh transistor and the pull-down module, and drain is connected to the second clock signal terminal;

the eleventh transistor, whose gate is connected to the pull-down module, source is connected to the source of the first transistor and the pull-down module, and drain is connected to the pull-down module; and a twelfth transistor, whose gate is connected to the pull-up control node, source is connected to the output terminal of the shift register unit, and drain is connected to the second clock signal terminal.

16. The display device according to claim 15, wherein the pull-down module comprises:

a thirteenth transistor, whose gate is connected to the pull-down control node, source is connected to a drain of a fourteenth transistor, the source of the eleventh transistor and the source of the first transistor, and drain is connected to the pull-up control node;

the fourteenth transistor, whose gate is connected to the pull-down control node, source is connected to the low level terminal, and drain is connected to the source of the eleventh transistor and the source of the first transistor;

a fifteenth transistor, whose gate is connected to the pull-down control node, source is connected to the low level terminal, and drain is connected to the source of the ninth transistor and the gate of the eleventh transistor;

a sixteenth transistor, whose gate is connected to the pull-down control node, source is connected to the low level terminal, and drain is connected to the source of the tenth transistor and the drain of the eleventh transistor; and a seventeenth transistor, whose gate is connected to the pull-down control node, source is connected to the low level terminal, and drain is connected to the output terminal of the shift register unit.

17. The display device according to claim 12, wherein the control signal terminal comprises the first clock signal terminal and the second clock signal terminal; the pull-down compensation module comprises a first pull-down compensation sub-module and a second pull-down compensation sub-module which are used for pulling down a signal of the pull-down control node at least twice alternatively when the pull-up control node is in the high-level state to pull down the signal of the pull-down control node to the low-level state.

18. The display device according to claim 17, wherein the first pull-down compensation sub-module comprises:

an eighteenth transistor, whose gate is connected to the first clock signal terminal, source is connected to a drain of a nineteenth transistor and a gate of a twentieth transistor, and drain is connected to the first clock signal terminal;

the nineteenth transistor, whose gate is connected to the pull-up control node, source is connected to the low level terminal, and drain is connected to the gate of the twentieth transistor;

the twentieth transistor, whose source is connected to the pull-down control node, and drain is connected to the first clock signal terminal; and a twenty-first transistor, whose gate is connected to the pull-up control node, source is connected to the low level terminal, and drain is connected to the pull-down control node.

19. The display device according to claim 17, wherein the second pull-down compensation sub-module comprises:

a twenty-second transistor, whose gate is connected to the second clock signal terminal, source is connected to a drain of a twenty-third transistor and a gate of a twenty-fourth transistor, and drain is connected to the second clock signal terminal;

the twenty third transistor, whose gate is connected to the pull-up control node, source is connected to the low level terminal, and drain is connected to a gate of the twenty-fourth transistor;

the twenty-fourth transistor, whose source is connected to the pull-down control node, and drain is connected to the second clock signal terminal; and a twenty-fifth transistor, whose gate is connected to the pull-up control node, source is connected to the low level terminal, and drain is connected to the pull-down control node.

20. The display device according to claim 16, wherein the low level terminal comprises a first low level terminal and a second low level terminal, and a voltage of a signal of the first low level terminal is higher than a voltage of a signal of the second low level terminal; and the source of the fourth transistor, the source of the sixth transistor, the source of the eighth transistor, the source of the fourteenth transistor and the source of the fifteenth transistor are connected to the second low level terminal, and the source of the sixteenth transistor and the source of the seventeenth transistor are connected to the first low level terminal.

* * * * *